US010790823B1

(12) United States Patent
Keyzer et al.

(10) Patent No.: US 10,790,823 B1
(45) Date of Patent: Sep. 29, 2020

(54) PROXIMITY-BASED POWER SWITCH APPEARANCE

(71) Applicant: Valve Corporation, Bellevue, WA (US)

(72) Inventors: Jeffrey Scott Keyzer, Redmond, WA (US); Michael Jacob Goerz, Snohomish, WA (US); Jeffrey Peter Bellinghausen, Kirkland, WA (US); Brian David Hensley, Seattle, WA (US); Jason Beach, Seattle, WA (US)

(73) Assignee: Valve Corporation, Bellevue, WA (US)

( * ) Notice: Subject to any disclaimer, the term of this patent is extended or adjusted under 35 U.S.C. 154(b) by 0 days.

(21) Appl. No.: 16/277,795

(22) Filed: Feb. 15, 2019

Related U.S. Application Data

(63) Continuation of application No. 15/981,759, filed on May 16, 2018, now abandoned.

(51) Int. Cl.
*G06F 3/044* (2006.01)
*H03K 17/96* (2006.01)

(52) U.S. Cl.
CPC .......... *H03K 17/962* (2013.01); *G06F 3/044* (2013.01); *H03K 2217/96079* (2013.01)

(58) Field of Classification Search
None
See application file for complete search history.

(56) References Cited

U.S. PATENT DOCUMENTS

| 4,264,903 A * | 4/1981 | Bigelow ............. G06F 3/03547 178/18.06 |
|---|---|---|
| D410,919 S | 6/1999 | Sato et al. |
| D510,076 S | 9/2005 | Wu |
| D513,410 S | 1/2006 | Moriya et al. |
| D524,271 S | 7/2006 | Itai et al. |
| D530,690 S | 10/2006 | Takahashi |
| D559,809 S | 1/2008 | Oota |
| D576,686 S | 9/2008 | Ashida et al. |
| D626,568 S | 11/2010 | Yagi |
| D635,143 S | 3/2011 | Derry et al. |
| D637,599 S | 5/2011 | Liao |
| D637,897 S | 5/2011 | Tedesco et al. |
| D637,898 S | 5/2011 | Tedesco et al. |

(Continued)

OTHER PUBLICATIONS

Restriction Requirement dated Jan. 2, 2020 for U.S. Appl. No. 29/647,890, 5 pages.

*Primary Examiner* — Nicholas J Lee
(74) *Attorney, Agent, or Firm* — Lee & Hayes, P.C.

(57) ABSTRACT

An electronic device may include a proximity sensor, a touch sensor, and one or more light emitting elements. The touch sensor may be configured to detect touch input provided on a surface of the electronic device at a location in front of the touch sensor for purposes of powering on the electronic device. Prior to powering on the electronic device, a location of the touch sensor may remain inconspicuous. When the proximity sensor detects an object, such as a user, which moves within a threshold distance from a surface of the electronic device, the location of the touch sensor can be made conspicuous. After the power switch is made conspicuous, the user is able to see where to provide touch input on the electronic device to power on the electronic device.

20 Claims, 8 Drawing Sheets

(56) References Cited

U.S. PATENT DOCUMENTS

| | | |
|---|---|---|
| D684,195 S | 6/2013 | Watanabe |
| D699,245 S | 2/2014 | Lee et al. |
| D705,870 S | 5/2014 | Jacobs et al. |
| D706,358 S | 6/2014 | Yamamoto et al. |
| D709,959 S | 7/2014 | Jacobs et al. |
| D721,138 S | 1/2015 | Barinaga et al. |
| D722,116 S | 2/2015 | Gottschalk |
| D733,548 S | 7/2015 | Brown et al. |
| D751,607 S | 3/2016 | Onoue et al. |
| D756,368 S | 5/2016 | Coleman et al. |
| D766,984 S | 9/2016 | Chatterjee et al. |
| D766,985 S | 9/2016 | Chatterjee et al. |
| D795,962 S | 8/2017 | Chatterjee et al. |
| D798,304 S | 9/2017 | Sung et al. |
| D798,955 S | 10/2017 | Chatterjee et al. |
| D805,130 S | 12/2017 | Sparks et al. |
| D805,132 S | 12/2017 | Sparks et al. |
| D813,222 S | 3/2018 | Driscoll et al. |
| D820,358 S | 6/2018 | Sparks et al. |
| D831,664 S | 10/2018 | Chen |
| D836,566 S | 12/2018 | Yagisawa et al. |
| D839,355 S | 1/2019 | Christie et al. |
| D839,356 S | 1/2019 | Sumii |
| D845,278 S | 4/2019 | Christie et al. |
| 10,318,034 B1* | 6/2019 | Hauenstein .......... G06F 3/04842 |
| D867,459 S | 11/2019 | Chatterjee et al. |
| 2003/0210235 A1* | 11/2003 | Roberts ................. G06F 3/0414 |
| | | 345/173 |
| 2011/0221509 A1* | 9/2011 | Bergamo ................ G06F 3/044 |
| | | 327/517 |
| 2012/0146925 A1* | 6/2012 | An ........................ G06F 3/0488 |
| | | 345/173 |
| 2013/0093728 A1* | 4/2013 | Oh .......................... G06F 3/016 |
| | | 345/175 |
| 2015/0199041 A1* | 7/2015 | Salter ..................... G06F 3/042 |
| | | 345/174 |
| 2016/0041742 A1* | 2/2016 | Takahara ............ G06F 3/04847 |
| | | 715/740 |

\* cited by examiner

PROXIMITY-BASED POWER SWITCH APPEARANCE

CROSS REFERENCE TO RELATED APPLICATION

This patent application is a continuation of and claims priority to co-pending and co-owned U.S. patent application Ser. No. 15/981,759, filed May 16, 2018, entitled "PROXIMITY-BASED POWER SWITCH APPEARANCE," which is hereby incorporated in its entirety by reference.

BACKGROUND

Video game consoles are often coupled to an existing display (e.g., a television (TV)) within a user's home and used to play video games. Because video game consoles are often utilized in a "living room" setting, game console hardware is typically designed with an aesthetically-pleasing look (e.g., with respect to the shape, color, material, etc.). For example, it has become popular to design game consoles with as few external buttons and surface features as possible, which allows for a smooth and sleek-looking console that is fit for a living room environment. However, minimizing buttons and other surface features makes the input mechanisms on the console (e.g., a power switch) inconspicuous, making it difficult for users to discern where and how to provide user input to the game console itself.

Provided herein are technical solutions to improve and enhance these and other systems.

BRIEF DESCRIPTION OF THE DRAWINGS

The detailed description is described with reference to the accompanying drawings. In the figures, the left-most digit(s) of a reference number identifies the figure in which the reference number first appears. The use of the same reference numbers in different figures indicates similar or identical components or features.

FIG. 3 shows the reference planes of the electronic device, and an example technique for dynamically making a location of a touch sensor of the electronic device conspicuous based on a proximity of an object to the electronic device.

FIG. 4 shows components of the electronic device including a faceplate having a proximity sensor and a touch sensor disposed on a back surface of the faceplate, as well as a substrate that is disposed behind the faceplate, the substrate having light emitting elements disposed on a front surface of the substrate.

DETAILED DESCRIPTION

Figure 1:
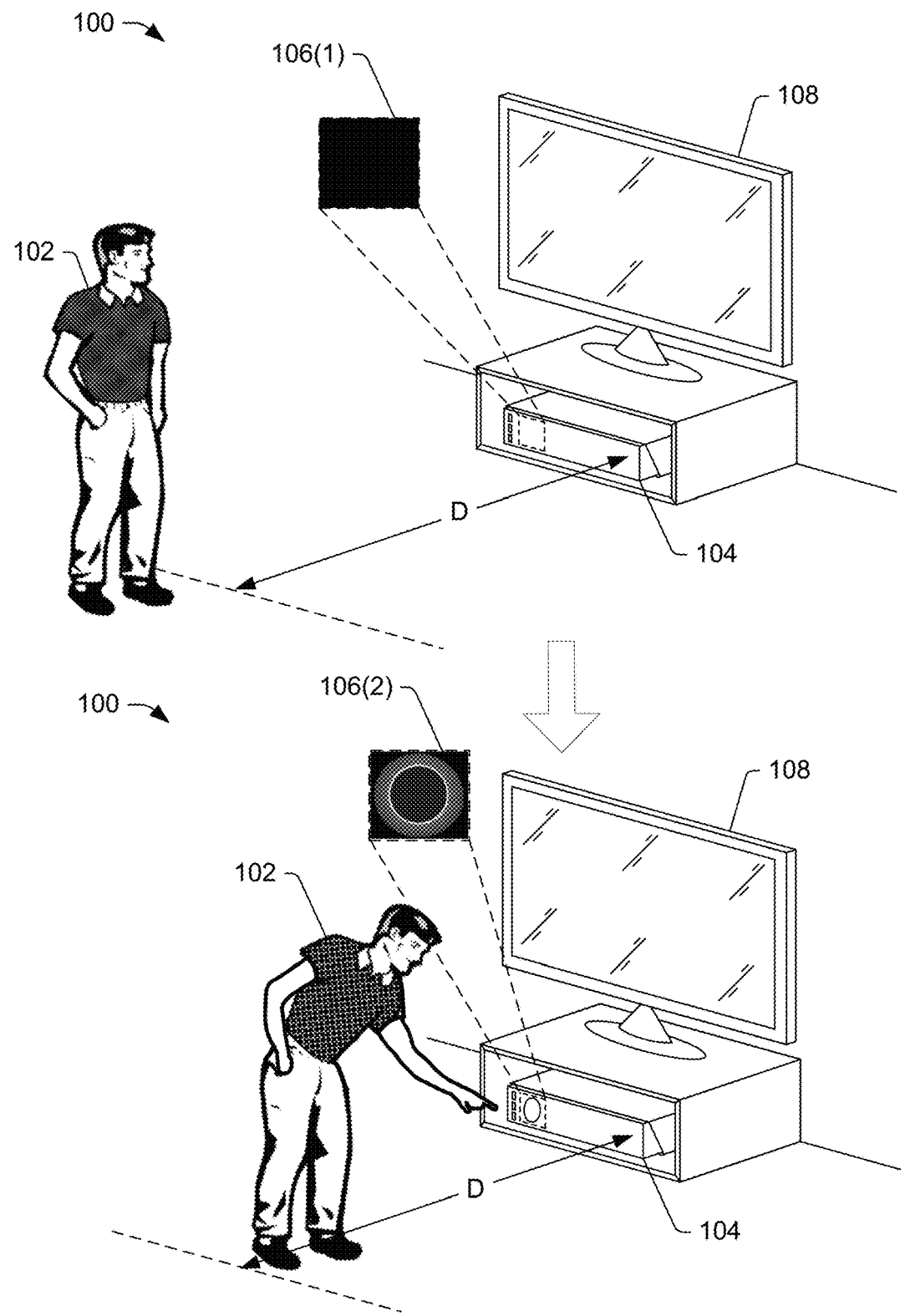
FIG. 1 is a diagram illustrating a technique for dynamically making a location of a touch sensor of an electronic device conspicuous based on a proximity of an object to the electronic device. The touch sensor of the electronic device may be associated with a power switch of the electronic device to power on the electronic device.

Described herein are, among other things, an electronic device having a proximity sensor, a touch sensor, and one or more light emitting elements, as well as the operation of these components to dynamically make a location of the touch sensor conspicuous based on the proximity of an object to a surface (e.g., the front surface) of the electronic device. For instance, the touch sensor may detect touch input provided on a surface (e.g., the front surface) of the electronic device for powering on the electronic device. Prior to powering on the electronic device, a location of the touch sensor may remain inconspicuous, yet, the location of the touch sensor can be made conspicuous as soon as an object, such as a user, approaches the electronic device. In this manner, the location where a user can touch the electronic device for powering on the electronic device appears when a body part of the user, such as a finger or a hand, moves within a threshold distance from a surface (e.g., the front surface) of the electronic device. After the location of the touch sensor is made conspicuous, the user is able to see where to provide touch input on the electronic device to power on the electronic device.

In some embodiments, the electronic device may comprise a game console. The game console may include a touch sensor that is configured to detect touch input when the touch input is provided at a particular location on a front surface of a faceplate of the game console. The device manufacturer may intentionally design the game console to hide or conceal the location of the touch sensor from view before a user approaches the console. Making the touch sensor inconspicuousness in this way enables the console to exhibit an aesthetically-appealing look (e.g., a smooth, sleek look), such as to the front faceplate of the game console. For instance, the faceplate of the game console may be substantially devoid of buttons or surface features that protrude from, or are defined in, the front surface of the faceplate. The faceplate may also be transparent to allow light—emitted from the one or more light emitting elements disposed behind the faceplate—to pass through the faceplate, thereby making the location of the touch sensor conspicuous through the use of visible light when the light emitting elements are illuminated. When the light emitting elements are off (i.e., not emitting light), the components that are disposed behind the faceplate at, or near the location of the touch sensor (e.g., the light emitting element(s), the touch sensor itself, etc.) may be obscured or concealed from view without inhibiting the transparent quality of the faceplate. For example, the faceplate can be made of a tinted material (e.g., a transparent material having a relatively low transmittance value, some color, etc.), which hides internal components in typical ambient lighting conditions.

An example electronic device, according to the embodiments described herein, may include a housing having a faceplate that is transparent, one or more processors, a touch sensor disposed behind the faceplate, the touch sensor associated with a power switch of the electronic device, a proximity sensor, and one or more light emitting elements disposed within the housing, behind the faceplate, and adjacent to the touch sensor. The electronic device may further include logic configured to illuminate the one or more light emitting elements based at least in part on proximity data provided by the proximity sensor that is indicative of an object having moved within a threshold distance from, but not in contact with, a front surface of the faceplate. The object may, for example, be a user who approaches the electronic device and who may be interested in powering on the electronic device. The faceplate, being transparent, allows at least some light emitted from the one or more light emitting elements to pass through the faceplate, which causes a location of the touch sensor to be made conspicuous when the object moves within the threshold distance from the front surface of the faceplate of the electronic device. The location of the touch sensor is made conspicuous due to the adjacency of the light emitting elements to the touch sensor.

The techniques and systems described herein allow for an electronic device to have an aesthetically-pleasing look in terms of a smoothness and a sleekness of the electronic device (e.g., little-to-no buttons or surface features on the surface(s)), while providing a mechanism to detect the proximity of a user to the electronic device so that a location of a touch sensor disposed behind a faceplate suddenly appears on the electronic device to let the user know where to provide touch input for powering on the electronic device.

FIG. 1 is a diagram illustrating a technique for dynamically making a location of a touch sensor of an electronic device conspicuous based on a proximity of an object to the electronic device, the touch sensor being associated with a power switch of the electronic device. In FIG. 1, an environment 100 (e.g., a living room of a user's home) is shown at two different points in time. In the top portion of FIG. 1, the user 102 is initially at a location that is beyond a threshold distance, D, the electronic device 104. In the bottom portion of FIG. 1, the user 102 has moved to a new location that within the threshold distance, D, from, but not in contact with, a surface (e.g., the front surface) of the electronic device 104. A proximity sensor of the electronic device 104 may be configured to detect objects, such as the user 102, that move within this threshold distance, D, from the electronic device 104.

In the example of FIG. 1, the electronic device 104 is in a power off state. A "power off state," as used herein, means that the electronic device 104 may be supplying power to a limited set of electrical components of the electronic device 104. That is, in the power off state, at least some of the electrical components, and perhaps a majority of the electrical components, of the electronic device 104 are not supplied with power from a power supply, such as a power outlet, a battery pack, etc.

A power switch of the electronic device 104 may be configured to selectively close a circuit for powering on the electronic device 104 such that the electronic device 104 transitions from a power off state to a "power on state." In the power on state, at least some of the electrical components of the electronic device 104 that were previously not supplied power are thereafter supplied power based on closure of the circuit. The electronic device 104 may include a touch sensor associated with this power switch, the touch sensor configured to detect an object contacting the front surface of a faceplate of the electronic device 104 at a particular location on the faceplate, which causes the power switch to close a circuit for powering on the electronic device 104. In FIG. 1, the location (or area) where touch input is detectable by the touch sensor is denoted by the close-up views 106(1) and 106(2).

The electronic device 104 may also include a proximity sensor that is configured to detect when an object has moved within the threshold distance, D, from, but not in contact with, the front surface of the faceplate of the electronic device 104. When an object (e.g., the user 102) is detected within the threshold distance, D, the proximity sensor may provide proximity data to one or more processors of the electronic device 104, which causes one or more light emitting elements disposed behind the faceplate adjacent to the touch sensor to illuminate (e.g., emit light). The faceplate of the electronic device 104 may be transparent to allow at least some of the light emitted from the light emitting element(s) to pass through the faceplate, rendering the location of the touch sensor visible to the user 102. This is shown by the close-up views 106 of the faceplate in FIG. 1. In the first close-up view 106(1), the location where the user 102 is to provide input to the touch sensor for powering on the electronic device 104 is inconspicuous. For example, the close-up view 106(1) shows a black-colored portion of the faceplate, and it is assumed that the remaining portion of the faceplate is also the same, or a similar, black color, thereby obfuscating the location of the touch sensor on the faceplate of the electronic device. The black color of the faceplate is non-limiting, as the faceplate of the electronic device 104 may be of any suitable color or shade (including white). To provide a faceplate with a dark shade of grey or a black color, a tinted acrylic or glass material may be used to form the faceplate, and the resulting faceplate may have a dark coloring to hide or conceal internal components of the electronic device 104, while still allowing light to pass through the transparent material of the faceplate. In the second close-up view 106(2), the location where the user 102 is to provide touch input to the touch sensor for powering on the electronic device 104 becomes conspicuous or visible due to the illumination of the light emitting element(s) behind the faceplate of the electronic device 104 causing a "ring" of light to appear on the faceplate.

Accordingly, the electronic device 104 can be in the power off state before the user 102 approaches the electronic device 104, and when the user 102 moves within the threshold distance, D, from the front surface of the faceplate of the electronic device 104, the proximity sensor of the electronic device 104 detects this condition, and provides proximity data to one or more processors, causing the light emitting element(s) of the electronic device 104 to illuminate, making the location of the power switch conspicuous or visible to the user 102. After the location of the power switch is made conspicuous, the user 102 can move closer to the electronic device 104 and touch the location on the faceplate marked by the light pattern in order to power on the electronic device 104.

It is to be appreciated that the electronic device 104 can be any suitable type of electronic device including, without limitation, a game console, a set-top box, a tablet computer, an electronic book (e-book) reader, a smart watch or similar wearable computer, a smart phone, any home appliance, a laptop or notebook computer, a desktop computer, a display device (e.g., a television (TV)), a navigation device (e.g., global positioning system (GPS) device), a point of sale terminal display, a device embedded in an automobile or any other type of vehicle (e.g., aircraft), an automated teller machine (ATM), a speech interface device (e.g., a smart speaker), or any similar electronic device. The example of FIG. 1 depicts an electronic device 104 in the form of a game console (also referred to as a "video game console"), which is coupled to a display 108 for outputting video game content on the display 108. Because example electronic devices 104 in the form of a game console are often described herein, the term "game console" may be used interchangeably with electronic device 104 herein. It follows that, whenever the techniques and systems are shown and described with respect to a game console herein, it is to be appreciated that other types of electronic devices, such as those enumerated above, may benefit from the technology described herein.

Figure 2:
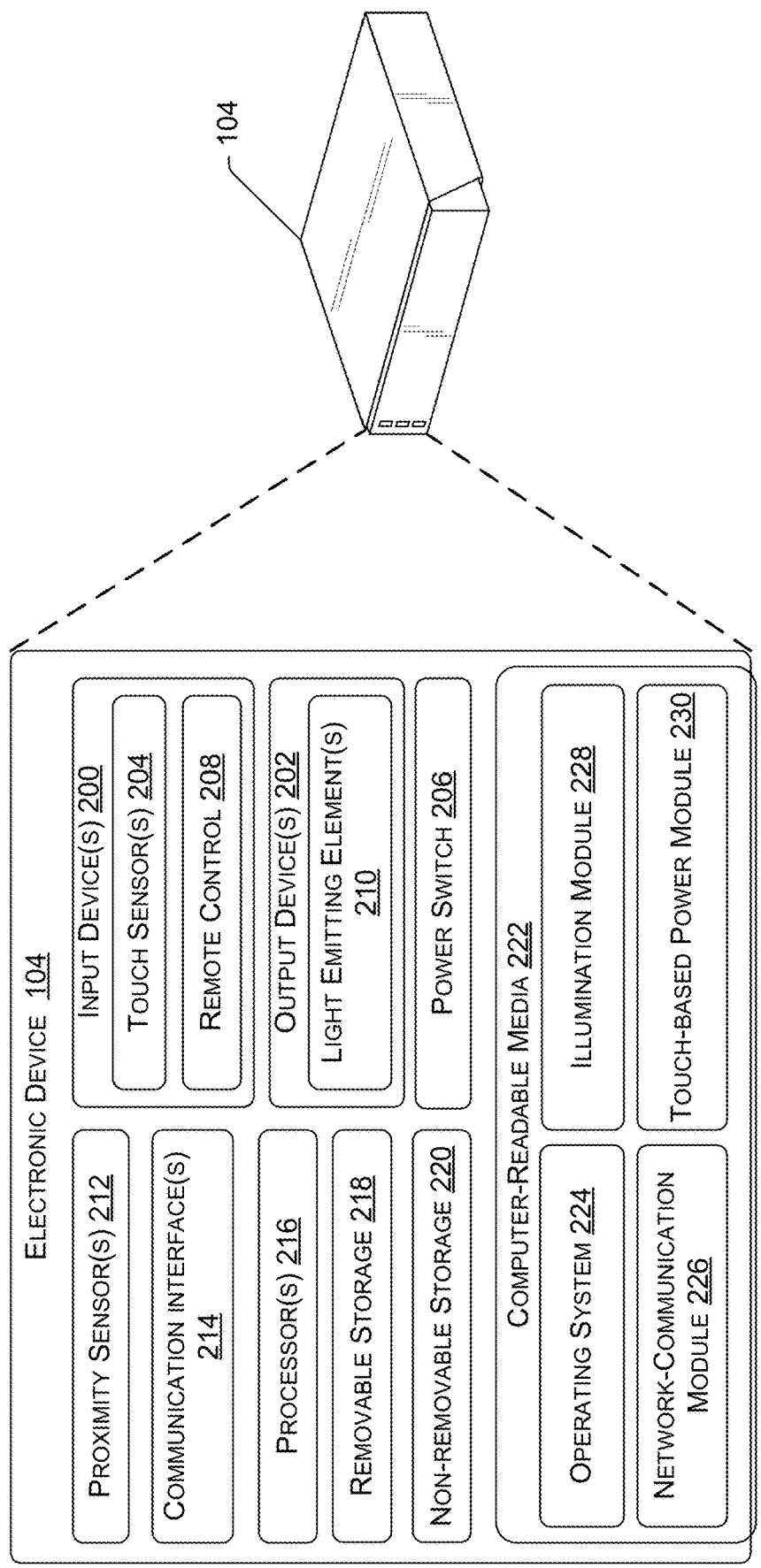
FIG. 2 illustrates components of an example electronic device.

FIG. 2 illustrates components of an example electronic device 104. Again, FIG. 2 shows an example electronic device 104 in the form of a game console, but it is to be appreciated that the electronic device 104 is not limited to a game console, as other types of electronic devices with similar characteristics are contemplated herein.

As illustrated, the electronic device 104 includes one or more input devices 200 and one or more output devices 202. The input device(s) 200 can include, among other types of input devices, a touch sensor(s) 204. The touch sensor 204 can be disposed behind a faceplate of the electronic device 104 such that the touch sensor 204 is configured to detect an object making contact with the front surface of the faceplate at a particular location (or area). The touch sensor 204 may be associated with a power switch 206 of the electronic device 104, the power switch 206 configured to selectively close a circuit based on touch data provided by the touch sensor 204. Closure of the circuit causes power to be supplied to one or more electrical components of the electronic device 104 (e.g., electrical component(s) that were previously not supplied power in the power off state). For example, in the implementation of a game console, a power off state of the game console may not supply power to a graphics processing unit (GPU) that is used to render graphics on an associated display 108. However, when a user touches a particular location on the front surface of the game console's faceplate, the touch sensor 204 may detect this contact event, and may cause the power switch 206 to close the circuit for supplying power to the GPU, among other electrical components. In this manner, the GPU does not operate in the power off state, but operates exclusively in the power on state to rendering graphics on the display 108 (e.g., to render video game content).

The touch sensor 204 can employ any suitable principle of operation to detect contact of an object on a surface (e.g., the front surface) of the electronic device 104, such as capacitive, resistive, surface acoustic wave (SAW), infrared, or other similar touch-based technologies. In implementations that utilize capacitive-based sensing, the touch sensor 204 may include electrodes (e.g., a transmitter electrode and/or a receiver electrode of a transcapacitive-type sensor), and voltage can be applied to the electrodes so that the electrodes are configured to measure capacitance changes at the electrodes, which can be translated into touch data. Capacitance changes at the electrodes of the touch sensor 204 may be influenced by an object (such as a human finger) that is in proximity to the electrodes. The sensitivity of the touch sensor 204 can be adjusted so that a contact with the front surface of the faceplate of the electronic device 104 may be detectable by the touch sensor 204, while an object in proximity, but not in contact, with the front surface of the faceplate may not be detectable by the touch sensor 204. A capacitive-based touch sensor 204 may be based on self-capacitance, mutual capacitance, or a combination thereof.

The input device(s) 200 can also include a remote control 208, such as a handheld controller, which may send data, wirelessly or via a wired connection, to the electronic device 104, wherein the data corresponds to user input that is provided on the remote control 208. The remote control 208 may include an infrared (IR) transmitter to send the data corresponding to user input in the form of IR light (e.g., pulses of IR light), and the game console 104 may include an IR receiver configured to receive the IR light output from the remote control 208, and to decode the type of user input from the received IR light (e.g., based on a unique pattern of IR light pulses corresponding to a specific button/control on the remote control 208). Such a remote control 208 can include, without limitation, joysticks, trackpads, triggers, etc. for providing input to the electronic device 104. Of course, other types of input devices 200 are contemplated, such as one or more microphones to receive audio input (e.g., voice input), one or more cameras (e.g., a depth camera or three dimensional (3D) camera, etc.), keyboard, keypad, mouse, touch screen, control buttons, or other types of sensors (e.g., inertial measurement unit (IMU)) to receive gestural input, such as motion of the remote control 208 and/or motion of the electronic device 104.

The output devices 202, meanwhile, may include, among other types of output devices, one or more light emitting elements 210. The light emitting element(s) 210 may include light emitting diodes (LEDs), or any similar type of emissive element that can emit light within the visible electromagnetic spectrum. As mentioned, and as described in more detail below, the light emitting elements 210 may be disposed within the housing of the electronic device 104, behind a faceplate of the electronic device 104, and adjacent to the touch sensor 204. "Adjacent," in this context, may mean within a threshold distance from the touch sensor 204 that is suitable for indicating, to a user, a location where touch input can be provided such that the touch input is detectable by the touch sensor 204. In some cases the threshold distance may be within a range of about ⅛ of an inch to 3 inches, but this range can vary depending on the size of the electronic device 104 and/or the size of the touch sensor 204. The adjacency of the light emitting element(s) 210 to the touch sensor 204 is for purposes of visibly indicating the location of the touch sensor 204 whenever the light emitting element(s) 210 are illuminated. Accordingly, the location of the touch sensor 204 may be inconspicuous when the light emitting element(s) 210 are not illuminated, which may provide a desired look to the electronic device 104.

Of course, the output device(s) 202 may include other types of output devices as well, such as a display, a vibrator to create haptic sensations, a speaker(s) (e.g., headphones), and/or the like. While a few examples have been provided, the electronic device 104 may additionally or alternatively comprise any other type of input device 200 or output device 202.

The electronic device 104 may further include a proximity sensor(s) 212, as mentioned above. A first proximity sensor 212(1) (See FIGS. 4 and 5) may be configured to detect when an object has moved within a threshold distance, D, from, but not in contact with, a surface of the electronic device 104 (e.g., a front surface of a faceplate of the electronic device 104). A second proximity sensor 212(2) (See FIGS. 4 and 5) may be configured to detect when a cord or cable (e.g., a USB cable) is plugged into a corresponding port (See apertures 304(1)-(3) in FIG. 3) on the faceplate of the electronic device 104. If and when the second proximity sensor 212(2) detects that a cord or cable has been plugged into a port on the faceplate, the sensitivity of the first proximity sensor 212(1) may be adjusted (e.g., by decreasing the sensitivity of the first proximity sensor 212(1)). After adjusting the sensitivity of the first proximity sensor 212(1) in this fashion, the threshold distance, D, may decrease, meaning that an object would have to move closer to the electronic device 104 before the object is detected by the first proximity sensor 212(1). Adjusting (e.g., decreasing) the sensitivity of the first proximity sensor 212(1) may be accomplished using an algorithm (e.g., an algorithm that increases a baseline proximity detection value), and the first proximity sensor 212(1) may thereafter detect other objects (e.g., a user 102) that approach the electronic device 104, while "tuning out" or ignoring unwanted objects, such as the aforementioned cord or cable that is plugged into the port on the electronic device 104. Throughout the disclosure, reference is made to "a proximity sensor 212." Unless otherwise specified, such a reference means the first proximity sensor 212(1). Any reference to "proximity sensors 212" means both proximity sensors 212(1) and 212(2) mentioned above, and described elsewhere in this disclosure.

Any suitable proximity sensing principle/technology can be employed by the proximity sensors 212. Suitable principles/technologies for proximity sensing include capacitive, optical (e.g., a depth camera), sonar, etc. In an implementation where the proximity sensors 212 are capacitive-based sensors, the proximity sensors 212 may include electrodes (e.g., a transmitter electrode and/or a receiver electrode of a transcapacitive-type sensor), and voltage can be applied to the electrodes so that the electrodes are configured to measure capacitance changes at the electrodes, which may be translated into proximity data. Capacitance changes at the electrodes of the proximity sensors 212 may be influenced by an object (such as a human body, or a part thereof, such as a finger, hand, or any electrically-grounded object, etc.) in proximity to the electrodes. The sensitivity of the proximity sensor 212 can be adjusted so that an object moving within a threshold distance, D, from, but not in contact with, the front surface of the faceplate of the electronic device 104 may be detectable by the proximity sensor 212. In some cases the threshold distance, D—within which objects become detectable by the proximity sensor 212—may be within a range of about 4 inches to 24 inches; alternatively the threshold distance, D, may be between 2 and 12 inches or some other distance. This dimension can vary, however, depending on the size of the electronic device 104. In a game console implementation, the threshold distance, D, may be within a range of about 6 inches to 12 inches to provide relatively long range sensing, yet to avoid detecting objects moving past the electronic device 104 (e.g., when a user 102 walks through the living room and passes by the game console). A capacitive-based proximity sensor 212 may be based on self-capacitance, mutual capacitance, or a combination thereof.

In addition, the electronic device 104 may include one or more communication interfaces 214 to facilitate a wired and/or wireless connection to a network, other local devices, and/or to one or more remote systems. The communication interfaces 214 may implement one or more of various wireless technologies, such as Wi-Fi, Bluetooth, radio frequency (RF), and so on. It is to be appreciated that the electronic device 104 may further include physical ports to facilitate a wired connection to a network, a connected peripheral device, or a plug-in network device that communicates with other wireless networks.

In the illustrated implementation, the electronic device 104 further includes one or more processors 216, removable storage 218, non-removable storage 220, and computer-readable media 222. In some implementations, the processors(s) 216 may include a central processing unit (CPU), a graphics processing unit (GPU), both CPU and GPU, a microprocessor, a digital signal processor or other processing units or components known in the art. Alternatively, or in addition, the functionally described herein can be performed, at least in part, by one or more hardware logic components. For example, and without limitation, illustrative types of hardware logic components that can be used include field-programmable gate arrays (FPGAs), application-specific integrated circuits (ASICs), application-specific standard products (ASSPs), system-on-a-chip systems (SOCs), complex programmable logic devices (CPLDs), etc. Additionally, each of the processor(s) 216 may possess its own local memory, which also may store program modules, program data, and/or one or more operating systems.

The removable storage 218, non-removable storage 220, and/or the computer-readable media 222 may include volatile and nonvolatile memory, removable and non-removable media implemented in any method or technology for storage of information, such as computer-readable instructions, data structures, program modules, or other data. Such memory includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, RAID storage systems, or any other medium which can be used to store the desired information and which can be accessed by a computing device. The computer-readable media 222 may be implemented as computer-readable storage media ("CRSM"), which may be any available physical media accessible by the processor(s) 216 to execute instructions stored on the computer-readable media 222. In one basic implementation, CRSM may include random access memory ("RAM") and Flash memory. In other implementations, CRSM may include, but is not limited to, read-only memory ("ROM"), electrically erasable programmable read-only memory ("EEPROM"), or any other tangible medium which can be used to store the desired information and which can be accessed by the processor(s) 216.

In general, the electronic device 104 may include logic (e.g., software, hardware, and/or firmware, etc.) that is configured to implement the techniques, functionality, and/or operations described herein. The computer-readable media 222 is shown as including various modules, such as instruction, datastores, and so forth, which may be configured to execute on the processor(s) 216 for carrying out the techniques, functionality, and/or operations described herein. A few example functional modules are shown as stored in the computer-readable media 222 and executable on the processor(s) 216, although the same functionality may alternatively be implemented in hardware, firmware, or as a system on a chip (SOC), and/or other logic.

An operating system module 224 may be configured to manage hardware within and coupled to the electronic device 104 for the benefit of other modules. In addition, the computer-readable media 222 may store a network-communications module 226 that enables the electronic device 104 to communicate, via the communication interfaces 214, with one or more other devices, such as a personal computing device, a remote server, the remote control 208, or the like.

The computer-readable media 222 may further include an illumination module 228 that is configured to control illumination of the light emitting element(s) 210. The control of the light emitting element(s) 210 may control on/off states, intensity level of light output, color output, and/or other parameters that provide different types of light output. The illumination module 228 may provide different control instructions based on proximity data provided by the proximity sensor 212. In addition, the illumination module 228 may control illumination of the light emitting element(s) 210 based on touch data provided by the touch sensor 204, and/or other factors (e.g., an ambient light sensor). For instance, the light emitting element(s) 210 may get brighter when the user 102 provides touch input detected by the touch sensor 204. As another example, the light emitting element(s) 210 may get dimmer when the ambient light sensor detects a decrease in an ambient light level.

The computer-readable media 222 may further include a touch-based power module 230 to selectively close a circuit (via the power switch 206) for supplying power to one or more electrical components of the electronic device 104 based on touch data provided by the touch sensor 204. In other words, the electronic device 104 can be powered on/off based on touch data provided by the touch sensor 204.

Figure 3:
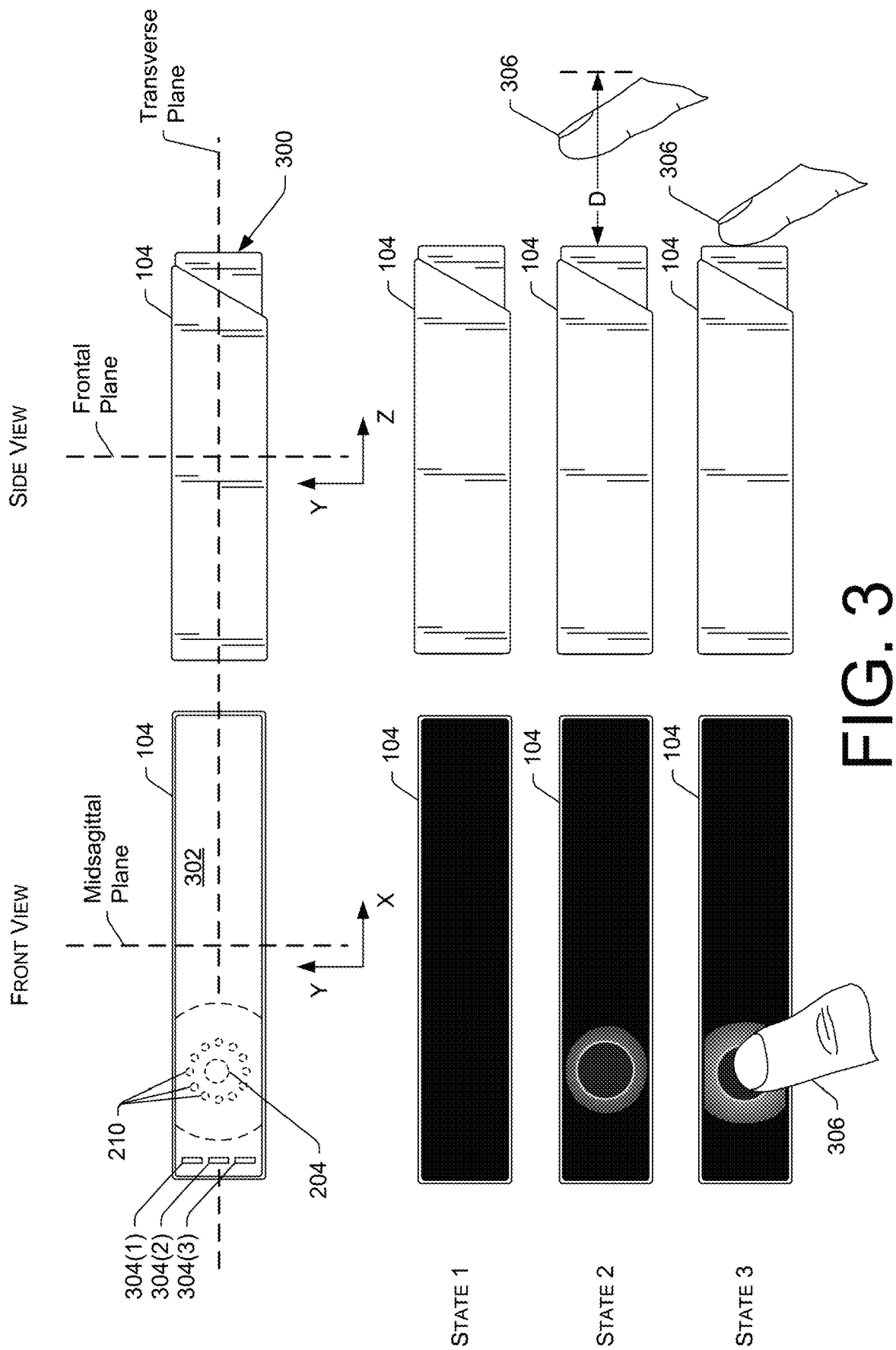
FIG. 3 illustrates front and side views of an example electronic device.

FIG. 3 illustrates front and side views of an example electronic device 104. FIG. 3 shows various planes of reference planes. As such, the front view of FIG. 3 shows an imaginary midsagittal plane that may run through the middle of the electronic device 104 and split the electronic device 104 into right and left sides. A transverse plane, which is an imaginary plane that divides the electronic device 104 into superior (top/upper) and inferior (bottom/lower) parts, is shown running horizontally across FIG. 3. Furthermore, the side view of FIG. 3 shows an imaginary frontal plane that divides the electronic device 104 into front and back parts. Accordingly, FIG. 3 illustrates a front surface 300 of the electronic device 104 (and more particularly, a front surface of a faceplate 302 of the electronic device 104) as being a surface parallel to the frontal plane on the front part of the electronic device 104. FIG. 3 further illustrates that a two-dimensional (2D) coordinate reference plane (e.g., an x-y plane) parallel to the frontal plane may be utilized to reference (x,y) point locations on the front surface 300 of the faceplate 302 of the electronic device 104. "Locations" on the front surface 300, as used herein, may mean "point locations" or "areas." The side view of FIG. 3 illustrates that a direction perpendicular to the front surface 300 of faceplate 302 may be represented by a z-direction in terms of Cartesian coordinates.

The front view of FIG. 3 shows three apertures 304(1), 304(2), and 304(3) that are defined in the faceplate 302 to accommodate cable connections, such as USB cables. This may allow for connecting auxiliary components, remote controls 208, thumb drives, etc. Other than these apertures, the faceplate 302 is substantially devoid of buttons or surface features that protrude from or are defined in the front surface 300.

The front view of FIG. 3 also shows the touch sensor 204 that is disposed within the housing of the electronic device 104, behind the faceplate 302 (as represented by the dashed circle with reference numeral 204 in FIG. 3). Thus, the touch sensor 204 may be disposed behind a location on the front surface 300 of the faceplate 302 that is represented by the dashed circle with reference numeral 204 in FIG. 3. The front view of FIG. 3 also shows a plurality of light emitting elements 210 that are also disposed within the housing of the electronic device 104, behind the faceplate 302 (as represented by the smaller dashed circles surrounding the touch sensor 204). The light emitting elements 210 can be disposed adjacent to the touch sensor 204 (e.g., within a threshold distance from the touch sensor 204) such that, when the light emitting elements 210 are illuminated, the location where the user 102 is to provide touch input to the touch sensor 204 is made conspicuous or visible.

FIG. 3 also shows an example technique for dynamically making a location of the touch sensor 204 of the electronic device 104 conspicuous based on a proximity of an object 306 to the electronic device, where after the object 306 contacts the front surface 300 to power on the electronic device 104. FIG. 3 shows three different states of the electronic device 104. In State 1, the electronic device 104 is in the power off state. As mentioned, in this power off state, proximate objects 306, and objects 306 contacting the front surface 300 of the faceplate 302, can be detected by the proximity sensor 212 and the touch sensor 204, respectively. In State 1, however, there are no objects within the threshold distance, D, from the front surface 300 of the faceplate 302. As a result, the location of the touch sensor 204 remains inconspicuous in State 1. For instance, the front surface 300 of the faceplate 302 may be a uniform color, smooth on the surface, and substantially devoid from buttons or surface features, except for perhaps a few apertures 304, as shown in FIG. 3. In addition, the material of the faceplate 302 may have a transmittance (e.g., a transmittance value), a color (e.g., a color value), and/or additional layers of opaque material that allow for obscuring internal components that are disposed behind the faceplate 302 and within the housing of the electronic device 104. For example, the faceplate 302 can be made of a tinted, transparent material (e.g., a dark colored acrylic, such as polymethylmethacrylate (PMMA), dark colored glass material, a clear acrylic that is painted with transparent ink, etc.) that conceals internal hardware of the electronic device 104, at least in typical ambient lighting conditions. The described characteristics may provide a faceplate 302 with a smooth, dark appearance that is devoid of markings or other features when the light emitting element(s) 210 are turned off, as depicted in State 1.

In State 2, the electronic device 104 is still in the power off state when an object 306, such as a user's 102 finger, approaches the electronic device 104 (e.g., from the front), and has moved within a threshold distance, D, from, but not in contact with, the front surface 300 of the faceplate 302. The proximity sensor 212 is configured to provide proximity data to the processor(s) 216 of the electronic device 104 in response to detecting this proximate object, the proximity data indicative of the object 306 (e.g., a grounded object) having moved within the threshold distance, D. Logic (e.g., hardware, software, and/or firmware, etc.) of the electronic device 104 is also configured to illuminate the light emitting element(s) 210 based at least in part on the proximity data provided by the proximity sensor 212 in order to make the location of the touch sensor 204 conspicuous, as shown in State 2. This is enabled by the faceplate 302 being made of a material that is transparent to permit at least some light that is emitted from the light emitting element(s) 210 to pass through the faceplate 302 near the location of the touch sensor 204. Although the faceplate 302 may be transparent across the entirety of the area of the faceplate 302, it is to be appreciated that additional opaque layers (e.g., paint layers) can be disposed on portions of the faceplate 302 (e.g., on a portion of the back surface of the faceplate 302) so that particular internal components remain hidden or concealed, even when the light emitting element(s) 210 are illuminated. However, at least a portion of the faceplate 302 near the touch sensor 204 and the light emitting element(s) 210 may be transparent (e.g., without additional opaque material layers that would otherwise block the transmission of light through the faceplate 302). The illuminated portion of the faceplate 302 shown in State 2 exhibits a circular light pattern to mark the location of the touch sensor 204 where the object 306 can touch the front surface 300 of the faceplate 302 to power on the electronic device 104. This may be enabled by arranging the light emitting elements 210 in a circular pattern. However, other patterns or shapes can be implemented (e.g., a square pattern, a triangular pattern, a dot, a line, etc.). The light exhibited in State 2 may be dispersed smoothly over an annular area by virtue of a light guide that is disposed on the back surface of the faceplate 302, as will be described in more detail below.

In State 3, the object 306 has contacted the front surface 300 of the faceplate 302 at a location on the front surface 300 of the faceplate 302 that is in front of the touch sensor 204, which causes the electronic device 104 to transition from the power off state to a power on state. For example, the touch sensor 204 is configured to provide touch data to the processor(s) 216 of the electronic device 104 in response to this condition, the touch data indicative of the object 306 (e.g., a grounded object) contacting the front surface 300 of the faceplate 302 at the location in front of the touch sensor 204. Logic (e.g., hardware, software, and/or firmware, etc.) of the electronic device 104 is configured to cause closure of a circuit based at least in part on the touch data provided by the touch sensor 204 (e.g., to power on the electronic device 104). In other words, the closure of the circuit (e.g., via the power switch 206) causes power to be supplied to the one or more electrical components of the electronic device 104. In some embodiments, the light emitting element(s) 210 may be controlled to emit light at different intensity levels depending on whether the object 306 is detected by the proximity sensor 212 or whether the object 306 is detected by the touch sensor 204. This is shown in State 3 by the light emitting element(s) 210 emitting light at an intensity level that is greater than the intensity level of light emitted in State 2. In other words, the object 306 touching the front surface 300 of the faceplate 302 at the location of the touch sensor 204 may cause the light emitting element(s) 210 to flash brighter (as compared to the level of intensity at which the light emitting element(s) 210 are illuminated in State 2). After flashing to a brighter intensity in State 3, the light emitting element(s) 210 may be controlled to revert to the same intensity level of light output as in State 2.

Although the faceplate 302 is shown as being on the front side of the electronic device 104 (i.e., parallel to the frontal plane), it is to be appreciated that the faceplate 302 can be disposed on other sides of the electronic device 104, without changing the basic principles of the techniques described herein. For example, the faceplate 302 can be disposed on the right, left, top, bottom, or back side of the electronic device 104 if touch input is to be provided on any one of those sides for powering on the electronic device 104. The faceplate 302 on the front side is merely illustrative.

Figure 4:
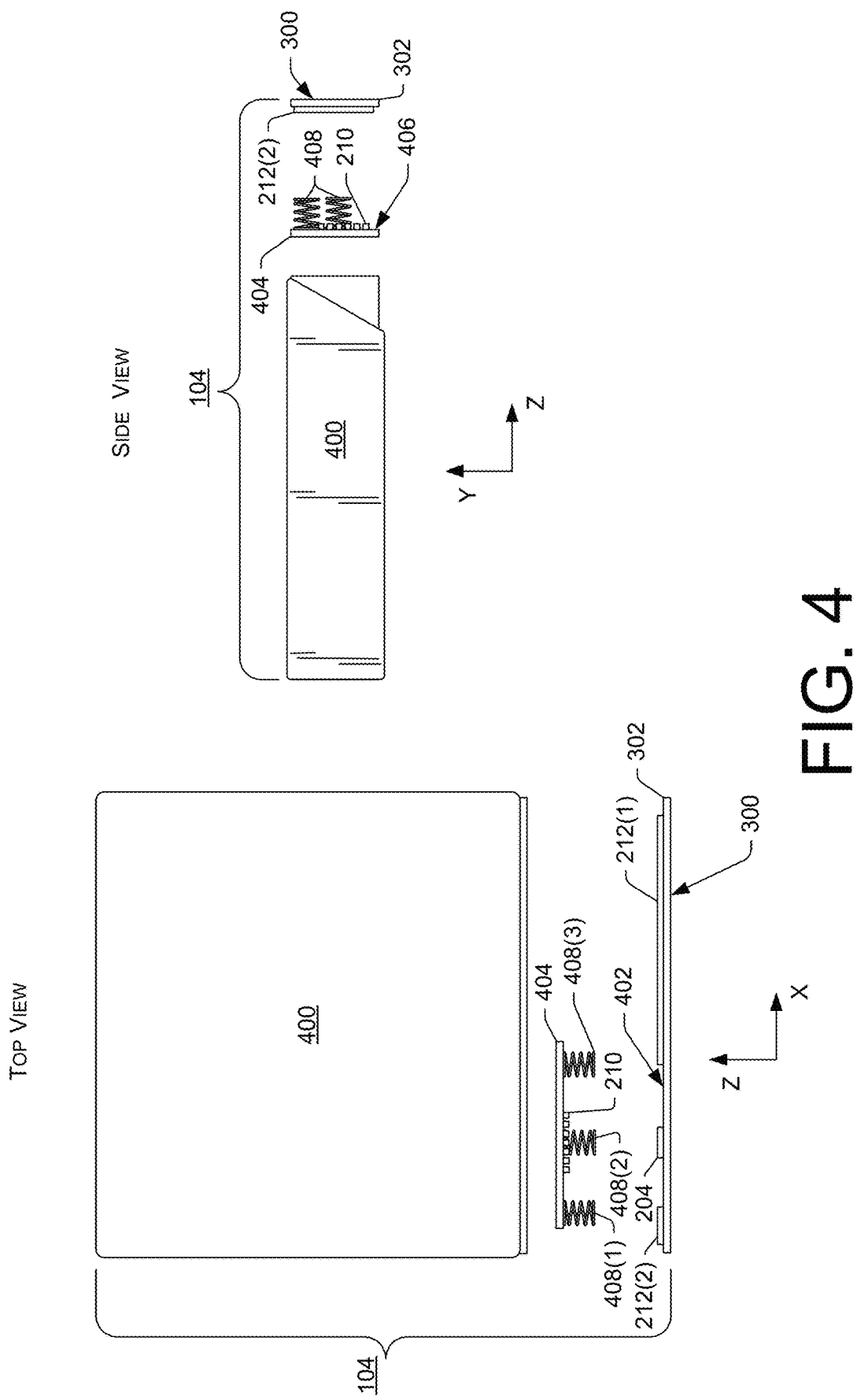
FIG. 4 illustrates partially-exploded top and side views of an example electronic device.

FIG. 4 illustrates partially-exploded top and side views of an example electronic device 104. FIG. 4 shows a main housing 400 of the electronic device 104, which may be shaped as a box with six sides. The faceplate 302 is shown in a decoupled state. Hence, when assembled, the faceplate 302 may be considered as one of the six sides of the box shaped housing 400. In the top view of FIG. 4, the faceplate 302 is shown as having the aforementioned front surface 300, as well as a back surface 402.

The first proximity sensor 212(1) may be disposed on the back surface 402 of the faceplate 302. In this configuration, the first proximity sensor 212(1) may be a first capacitive sensor element. Such a capacitive sensor element may be a metallic (e.g., silver) material that is printed or otherwise attached or mounted to the back surface 402 of the faceplate 302. The first proximity sensor 212(1) may span a portion of the area of the faceplate 302 on the back surface 402 of the faceplate 302.

The touch sensor 204 may also be disposed on the back surface 402 of the faceplate 302. In this configuration, the touch sensor 204 may be a second capacitive sensor element. Such a capacitive sensor element may be a metallic (e.g., silver) material that is printed or otherwise attached or mounted to the back surface 402 of the faceplate 302 at a different location from the first proximity sensor 212(1). In some embodiments, the touch sensor 204 may be a circle of metal material printed on the back surface 402 of the faceplate 302 in order to enable detection of a contact between a human finger and the front surface 300 of the faceplate 302.

The second proximity sensor 212(2) may be disposed on the back surface 402 of the faceplate 302. In this configuration, the second proximity sensor 212(2) may be a third capacitive sensor element on the back surface 402 of the faceplate. Such a capacitive sensor element may be a metallic (e.g., silver) material that is printed or otherwise attached or mounted to the back surface 402 of the faceplate 302. As mentioned, the second proximity sensor 212(2) may be configured to detect when a cord or cable (e.g., a USB cable) is plugged into a corresponding port (e.g., one of the apertures 304(1)-(3)) on the faceplate 302 of the electronic device 104. If and when the second proximity sensor 212(2) detects that a cord or cable has been plugged into a port on the faceplate 302, the sensitivity of the first proximity sensor 212(1) may be adjusted (e.g., by decreasing the sensitivity of the first proximity sensor 212(1)). After adjusting the sensitivity of the first proximity sensor 212(1) in this fashion, the threshold distance, D, may decrease, meaning that an object would have to move closer to the electronic device 104 before the object is detected by the first proximity sensor 212(1). Adjusting (e.g., decreasing) the sensitivity of the first proximity sensor 212(1) may be accomplished using an algorithm (e.g., an algorithm that increases a baseline proximity detection value), and the first proximity sensor 212(1) may thereafter detect other objects (e.g., a user 102) that approach the electronic device 104, while "tuning out" or ignoring unwanted objects, such as the aforementioned cord or cable that is plugged into the port on the electronic device 104.

FIG. 4 also shows a substrate 404 disposed behind the faceplate 302. The substrate 404 may be formed of one or more layers (e.g., planar, rectangular layers) of material. For example, the substrate 404 may comprise a printed circuit board (PCB). The light emitting elements 210 may be disposed (e.g., mounted) on a front surface 406 of the substrate 404. The location(s) on the front surface 406 of the substrate 404 where the light emitting element(s) 210 are disposed may correspond to a location of the touch sensor 204 on the back surface 402 of the faceplate 302. For example, when the electronic device 104 is assembled, the light emitting element(s) 210 on the substrate 404 may be positioned on a plane parallel to the frontal plane, and the touch sensor 204 may be positioned on another plane parallel to the frontal plane such that the light emitting elements(s) 210 are positioned behind (e.g., on a different plane than) the touch sensor 204. The light emitting element(s) 210 may also be arranged on the front surface 406 of the substrate 404 in a manner to denote the location of the touch sensor 204. A circular pattern is suitable for this purpose, such that the light emitting element(s) 210 may be arranged in a circular pattern to surround the touch sensor 204.

The substrate 404 may also have one or more biased members 408 extending from the front surface 406 of the substrate 404. FIG. 4 shows three biased members 408(1), 408(2), and 408(3) as an example. These biased members 408 may be electrically conductive (e.g., metal springs) can configured to depress inward towards the front surface 406 of the substrate 404, where after the biased members 408 provide an outward biasing force in a direction pointing away from the front surface 406 of the substrate 404. When the electronic device 104 is assembled, the biased members 408 contact the capacitive sensor elements disposed on the back surface 402 of the faceplate 302. For example, the biased member 408(2) may contact the touch sensor 204 when the electronic device 104 is assembled. This biased member 408(2), being electrically conductive, may act as an electrode of a capacitive-based touch sensor 204, the electrode being configured to measure capacitance changes with respect to the touch sensor 204. The biased member 408(2) also provides a path of electrical conductivity to circuitry that may be included in the substrate 404 for providing touch data to the processor(s) 216 of the electronic device 104. Similarly, the biased member 408(1) may contact the second proximity sensor 212(2), and the biased member 408(3) may contact the first proximity sensor 212(1) when the electronic device 104 is assembled. These biased members 408(1)/(3), being electrically conductive, may act as electrodes of capacitive-based proximity sensors 212, the electrodes being individually configured to measure capacitance changes with respect to the proximity sensors 212. The biased members 408(1)/(3) also provide a path of electrical conductivity to circuitry that may be included in the substrate 404 for providing proximity data to the processor(s) 216 of the electronic device 104. In some embodiments, the substrate 404 may further include, among other components, an IR receiver that is configured to receive IR light output from a remote control 208, and to decode a type of user input provide at the remote control 208 from the received IR light (e.g., the type of user input may be determined based on a unique pattern of IR light pulses corresponding to a specific button/control on the remote control 208).

Figure 5:
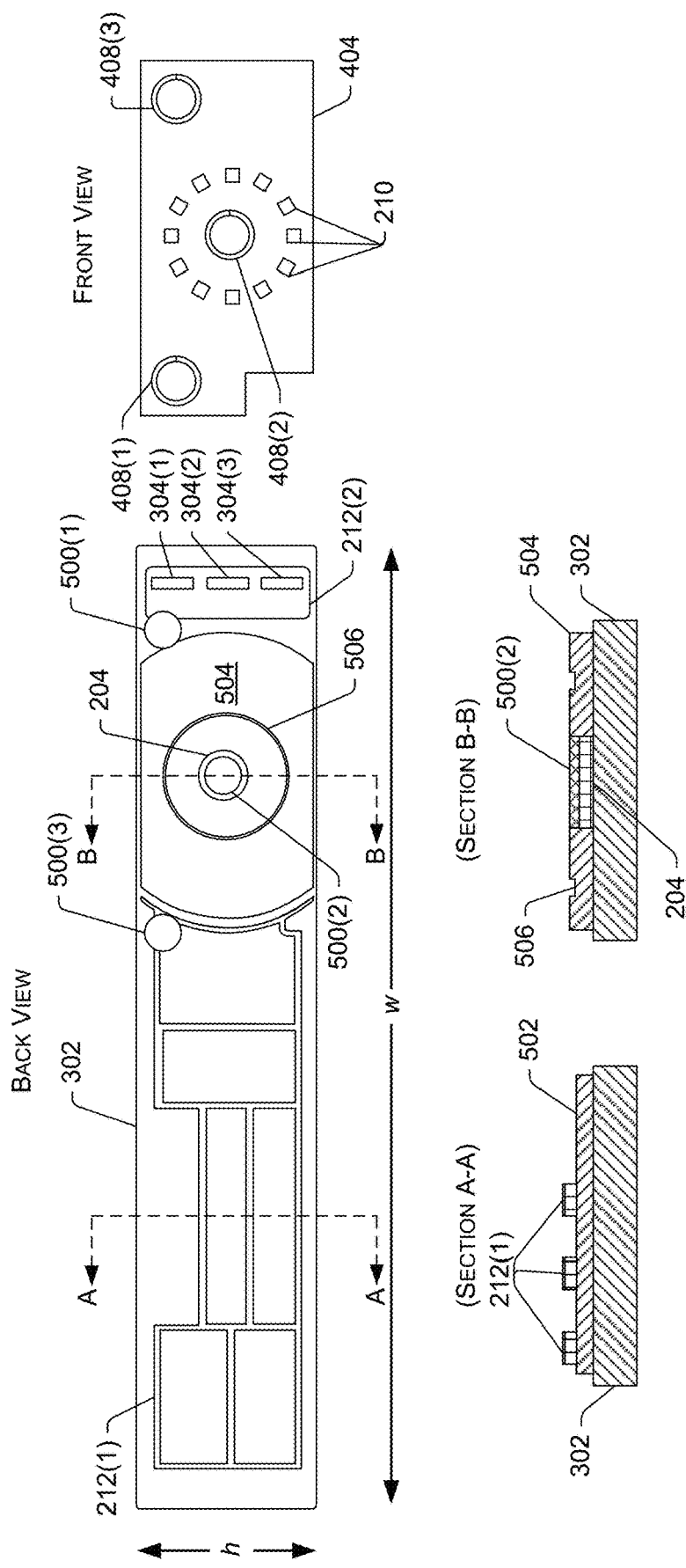
FIG. 5 illustrates a back view of the example faceplate of FIG. 4, two different cross-sectional views of the faceplate, and a front view of the example substrate of FIG. 4 having light emitting elements disposed thereon.

FIG. 5 illustrates a back view of the example faceplate 302 of FIG. 4, two different cross-sectional views (Section A-A and Section B-B) of the faceplate 302, and a front view of the example substrate 404 of FIG. 4. As shown by the back view of the faceplate 302 in FIG. 5, the first proximity sensor 212(1) may include a capacitive sensor element that is a pattern of metal material (e.g., silver) printed on the back surface 402 of the faceplate 302. The faceplate 302 may be rectangular in shape, wherein a first dimension (e.g., a width, w) of the faceplate 302 is longer than a second dimension (e.g., a height, h) of the faceplate 302. In this configuration, the first proximity sensor 212(1) may be a capacitive sensor element that spans at least half of the first dimension, w, and at least half of the second dimension, h. FIG. 5 shows that the first proximity sensor 212(1) may be disposed on one side of the touch sensor 204, while the second proximity sensor 212(2) may be disposed on the opposite side of the touch sensor 204. For instance, the second proximity sensor 212(2) may be disposed near (e.g., around) the apertures 304(1)-(3) in the faceplate 302. In this manner, the second proximity sensor 212(2) is configured to detect when a cord or cable (e.g., a USB cable) is plugged into a one of the apertures 304(1)-(3)) on the faceplate 302.

Contacts 500(1) and 500(3) may facilitate electrical contact between the electrically-conductive biased members 408(1) and (3) and the proximity sensors 212. Similarly, a contact 500(2) may facilitate electrical contact between the electrically-conductive biased member 408(2) and the touch sensor 204. The contacts 500(1) and 500(3) are disposed on the back surface 402 of the faceplate 302 in contact with the proximity sensors 212 (e.g., capacitive sensor elements), and the contacts 500(1) and 500(3) are positioned on the faceplate 302 to contact the biased members 408(1) and 408(3), respectively, when the electronic device 104 is assembled. The contact 500(2) is disposed on the back surface of the touch sensor 204 so that the biased member 408(2) contacts the contact 500(2) when the electronic device 104 is assembled. These contacts 500 may be circular, printed elements that are electrically conductive (e.g., made of carbon material, metallic material, etc.).

As shown in the cross-sectional view of the faceplate 302 taken along Section A-A, an opaque layer of material 502 may be disposed between the proximity sensors 212 (e.g., in the form of a pattern of metal material) and the back surface 402 of the faceplate 302. This opaque layer of material 502 may be a layer of paint that is applied to the back surface 402 of the faceplate 302 before printing the metal material of the proximity sensors 212 onto the back surface 402 of the faceplate 302 so that the proximity sensors 212 can be hidden or concealed from view, even when the light emitting element(s) 210 are illuminated.

As shown in the front view of the substrate 404 in FIG. 5, the light emitting elements 210 are arranged in a circular pattern on the front surface 406 of the substrate 404. When the electronic device 104 is assembled, the circular pattern of light emitting elements 210 encircles the touch sensor 204 to denote the location of the touch sensor when the light emitting elements 210 are illuminated.

FIG. 5 also shows a light guide 504 that is disposed on the back surface 402 of the faceplate 302. The light guide 504 may be made of a material configured to disperse light and distribute the light evenly, or in a gradient pattern, across the light guide 504. The light guide 504 can also be annular in shape to at least partially surround the touch sensor 204, as depicted in the back view of the faceplate 302 and the cross-sectional view of the faceplate 302 taken along Section B-B. The light guide 504 may have an annular feature 506, such as a groove, a transition to a different material, etc., which may accentuate the light output along the annular feature 506. This may facilitate a halo effect to the light output through the faceplate 302 whereby the light pattern exhibits a defined circle at the annular feature 506, and a lesser intense gradient of light that is dispersed outward toward the periphery of the light guide 504. FIG. 3 illustrates this halo effect that can be achieved using the light guide 504 in combination with the light emitting elements 210.

As mentioned, In addition, the material of the faceplate 302 may be transparent to allow the passage of light through portions of the faceplate 302. Notably, the portion of the faceplate 302 shown in the cross-sectional view of the faceplate 302 taken along Section B-B may not have opaque layers of material between the faceplate 302 and the light guide 504, which allows at least some light emitted by the light emitting elements 210 to pass through the faceplate 302 (e.g., via the light guide 504). In order to better conceal the inner components of the electronic device 104—at least when the light emitting elements 210 are turned off (i.e., not emitting light)—the material of the faceplate may be tinted, or may otherwise have a low transmittance (e.g., a transmittance value that is no greater than about 30%) In some cases, the transmittance value of the faceplate material may be no greater than about 5%. The faceplate 302 material may have some discernable color (e.g., a B* value no less than about 0.5) to help conceal components inside the housing 400 in typical ambient light conditions. The faceplate 302 can be made of any suitable material, such as PMMA, a polycarbonate (PC), glass, acrylic, or a combination thereof.

The processes described herein are illustrated as a collection of blocks in a logical flow graph, which represent a sequence of operations that can be implemented in hardware, software, or a combination thereof. In the context of software, the blocks represent computer-executable instructions that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes.

Figure 6:
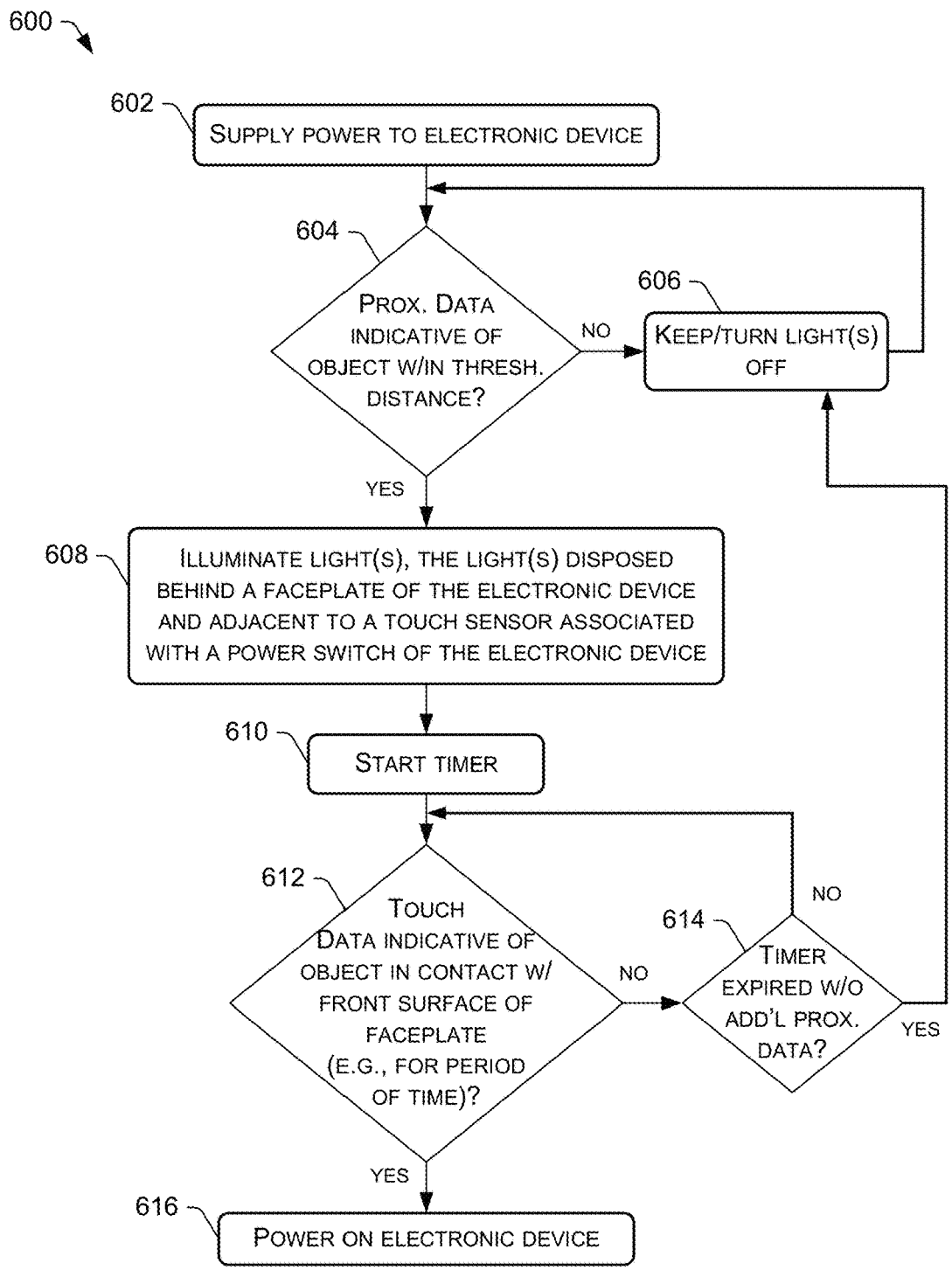
FIG. 6 is a flow diagram of an example process for dynamically making a location of a touch sensor of an electronic device conspicuous based on a proximity of an object to the electronic device, and powering on the electronic device based on an object contacting the front surface of a faceplate of the electronic device at the location of the touch sensor.

FIG. 6 is a flow diagram of an example process 600 for dynamically making a location of a touch sensor 204 of an electronic device 104 conspicuous based on a proximity of an object to the electronic device 104, and powering on the electronic device 104 based on an object contacting the front surface 300 of a faceplate 302 of the electronic device 104 at the location of the touch sensor 204. For discussion purposes, the process 600 is described with reference to the previous figures.

At 602, power may be supplied to an electronic device 104. For example, the electronic device 104 may be plugged into a power outlet in the wall of a house or a similar environment. Although power is supplied to the electronic device 104 at block 602, the electronic device 104 may remain in a power off state, as described herein. Also, assuming no object is within a threshold distance, D, from the front surface 300 of the electronic device 104 at block 602, the light emitting element(s) 210 are turned off (i.e., not emitting light) at block 602.

At 604, a determination may be made as to whether proximity data has been provided by a proximity sensor 212 of the electronic device 104 to a processor(s) 216 of the electronic device 104, the proximity data being indicative of an object 306 having moved within a threshold distance, D, from, but not in contact with, a front surface 300 of a faceplate 302 of the electronic device 104. If it is determined, at block 604, that no such proximity data has been provided by the proximity sensor 212, the process 600 may follow the "NO" route from block 604 to block 606 where the light emitting element(s) 210 remain off (i.e., not emitting light), and the process 600 iterates the determination at block 604. As soon as an object 306 moves within the threshold distance, D, from, but not in contact with, the front surface 300 of the faceplate 302 of the electronic device 104, as indicated by proximity data provided by the proximity sensor 212, the process 600 may follow the "YES" route from block 604 to block 608.

At 608, based at least in part on the proximity data provided by the proximity sensor 212, the light emitting element(s) 210 may be illuminated. The light emitting element(s) 210 may be disposed within the housing 400, behind the faceplate 302, and adjacent to a touch sensor 204 of the electronic device 104. The touch sensor 204 may be associated with a power switch 206 of the electronic device 104 such that the light emitting element(s) 210 make conspicuous the location on the faceplate 302 where touch input can be provided to power on the electronic device 104. A user 102 can see the light emitted by the light emitting element(s) 210 due to the transparency of the faceplate 302 material near the touch sensor 204.

At 610, a timer may be started in response to the illumination of the light emitting element(s) 210 at block 608. This timer may run for a period of time, during which the light emitting element(s) 210 may remain illuminated. It is to be appreciated that the timer may be reset whenever additional proximity data is provided by the proximity sensor 212 (e.g., whenever the user 102 moves closer to, but not in contact with, the front surface 300 of the faceplate 302). Thus, if the user 102 subsequently moves away from the electronic device 104 and beyond the threshold distance, the timer may run from the most recent proximity data that was provided by the proximity sensor 212.

At 612, a determination may be made as to whether touch data has been provided by a touch sensor 204 of the electronic device 104 to a processor(s) 216 of the electronic device 104, the touch data being indicative of an object 306 contacting the front surface 300 of a faceplate 302 at a location on the front surface in front of the touch sensor 204. If it is determined, at block 612, that no such touch data has been provided by the touch sensor 204, the process 600 may follow the "NO" route from block 612 to block 614.

At 614, a determination may be made as to whether the timer (started at block 610) has expired without the processor(s) 216 receiving any additional proximity data from the proximity sensor 212. If the period of time corresponding to this timer has not lapsed, the process 600 may follow the "NO" route from block 614 and iterate the determination at block 612 to monitor for touch detectable by the touch sensor 204. If no touch data, and no additional proximity data, is received by the time the timer expires, the process 600 may follow the "YES" route from block 614 to block 606 where the light emitting element(s) 210 may be turned off (i.e., the illumination of the light emitting element(s) 210 may cease at block 606). The process 600 may iterate from block 604 after turning off the light emitting element(s) 210 at block 606.

If, at block 612, an object 306 contacts the front surface 300 of the faceplate 302 at a location on the front surface 300 in front of the touch sensor 204, as indicated by touch data provided by the touch sensor 204, the process 600 may follow the "YES" route from block 612 to block 616 where the electronic device 104 may be powered on. In other words, logic may be configured to closure of a circuit based at least in part on the touch data provided by the touch sensor 204 at block 612, wherein the closure of the circuit causes power to be supplied to the one or more electrical components of the electronic device 104.

As noted in block 612, the electronic device 104 may be powered on if the user 102 touches the faceplate for a period of time (e.g., a touch-and-hold implementation). In other words, logic of the electronic device 104 may be configured to determine, based at least in part on the touch data, that the object 306 has remained in contact with the front surface 300 of the faceplate 302 at the location in front of the touch sensor 204 for a predefined period of time (e.g., a quarter of a second, a half of a second, etc.), wherein the closure of the circuit is caused based at least in part on the object 306 remaining in contact with the front surface 300 of the faceplate 302 at the location for the predefined period of time. A benefit of a press-and-hold implementation is that accidental touches may not cause the electronic device 104 to power on.

In some embodiments, the electronic device 104 may be configured to provide feedback to indicate to a user 102 that the electronic device has been powered on at block 616. Any suitable feedback can be utilized, such as audible feedback (e.g., a tone, beep, etc.), visual feedback (e.g., a brief flash or a brief dimming of the light emitting element(s) 210), haptic feedback (e.g., a vibratory sensation by a haptic feedback element near the touch sensor 204, etc.).

Figure 7:
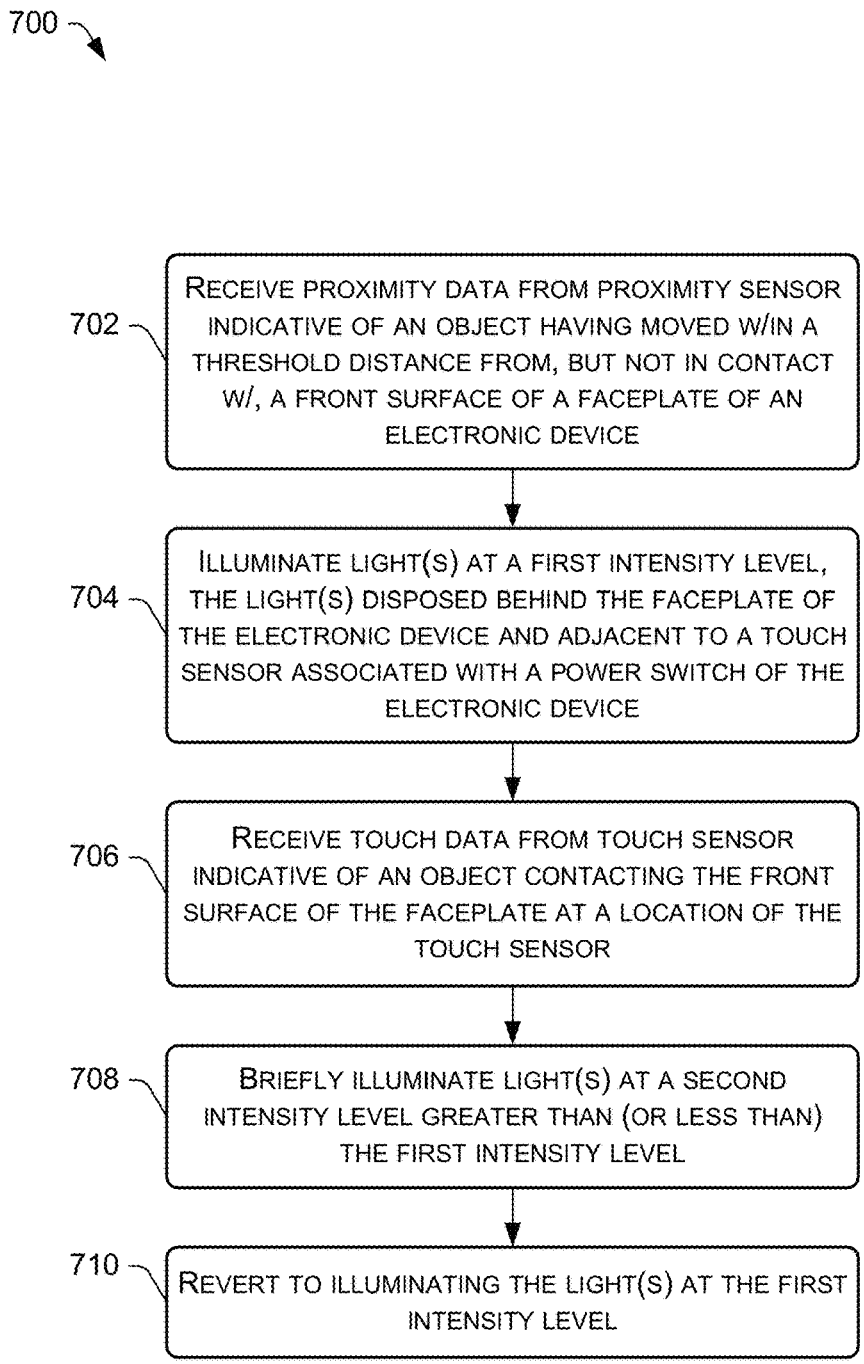
FIG. 7 is a flow diagram of an example process for controlling the illumination intensity of one or more light emitting elements at different levels based on proximity data provided by a proximity sensor and touch data provided by a touch sensor.

FIG. 7 is a flow diagram of an example process 700 for controlling the illumination intensity of one or more light emitting elements 210 at different levels based on proximity data provided by a proximity sensor 212 and touch data provided by a touch sensor 204. For discussion purposes, the process 700 is described with reference to the previous figures.

At 702, a processor(s) 216 of an electronic device 104 may receive proximity data from a proximity sensor 212, the proximity data indicative of an object 306 having moved within a threshold distance, D, from, but not in contact with, a front surface 300 of a faceplate 302 of the electronic device 104.

At 704, based at least in part on the proximity data provided by the proximity sensor 212, light emitting element(s) 210 of the electronic device 104 may be illuminated at a first intensity level. This first intensity level may be associated with a proximity event detected by the proximity sensor 212 such that the light emitting element(s) 210 illuminate to a particular brightness when an object 306 approaches, but does not contact, the front surface 300 of the electronic device 104. Again, the light emitting element(s) 210 may be disposed within the housing 400, behind the faceplate 302, and adjacent to a touch sensor 204 of the electronic device 104, which can detect a touch event for powering on the electronic device 104.

At 706, the processor(s) 216 of an electronic device 104 may receive touch data from the touch sensor 204, the touch data indicative of an object 306 having made contact with the front surface 300 of the faceplate 302 of the electronic device 104 at a location in front of the touch sensor 204.

At 708, based at least in part on the touch data provided by the touch sensor 204, the light emitting element(s) 210 may be illuminated at a second intensity level different than (e.g., greater than or less than) the first intensity level. This second intensity level may be associated with a touch event detected by the touch sensor 204 such that the light emitting element(s) 210 brighten or dim (relative to the brightness at block 704) when an object 306 contacts the front surface 300 of the electronic device 104 at the location in front of the touch sensor 204. This increase (or decrease) in brightness at block 708 may be brief (e.g., the light emitting element(s) 210 may be illuminated at the second intensity level for a short period of time while the object contacts the front surface 300 of the faceplate 302).

At 710, logic of the electronic device 104 may revert to illuminating the light emitting element(s) 210 at the first intensity level after illuminating the light emitting element(s) 210 at the second intensity level. In other words, a brief flash of brightness may be emitted based on a touch event.

In some embodiments, after a proximity event, but before a touch event, the brightness of the light emitting element(s) 210 may gradually increase as an object moves closer to the front surface 300 of the faceplate 302, and/or may gradually decrease as an object moves farther away from the front surface 300 of the faceplate 302, or vice versa. As mentioned, brightness levels can be adjusted based on ambient light conditions sensed by an ambient light sensor as well.

Figure 8:
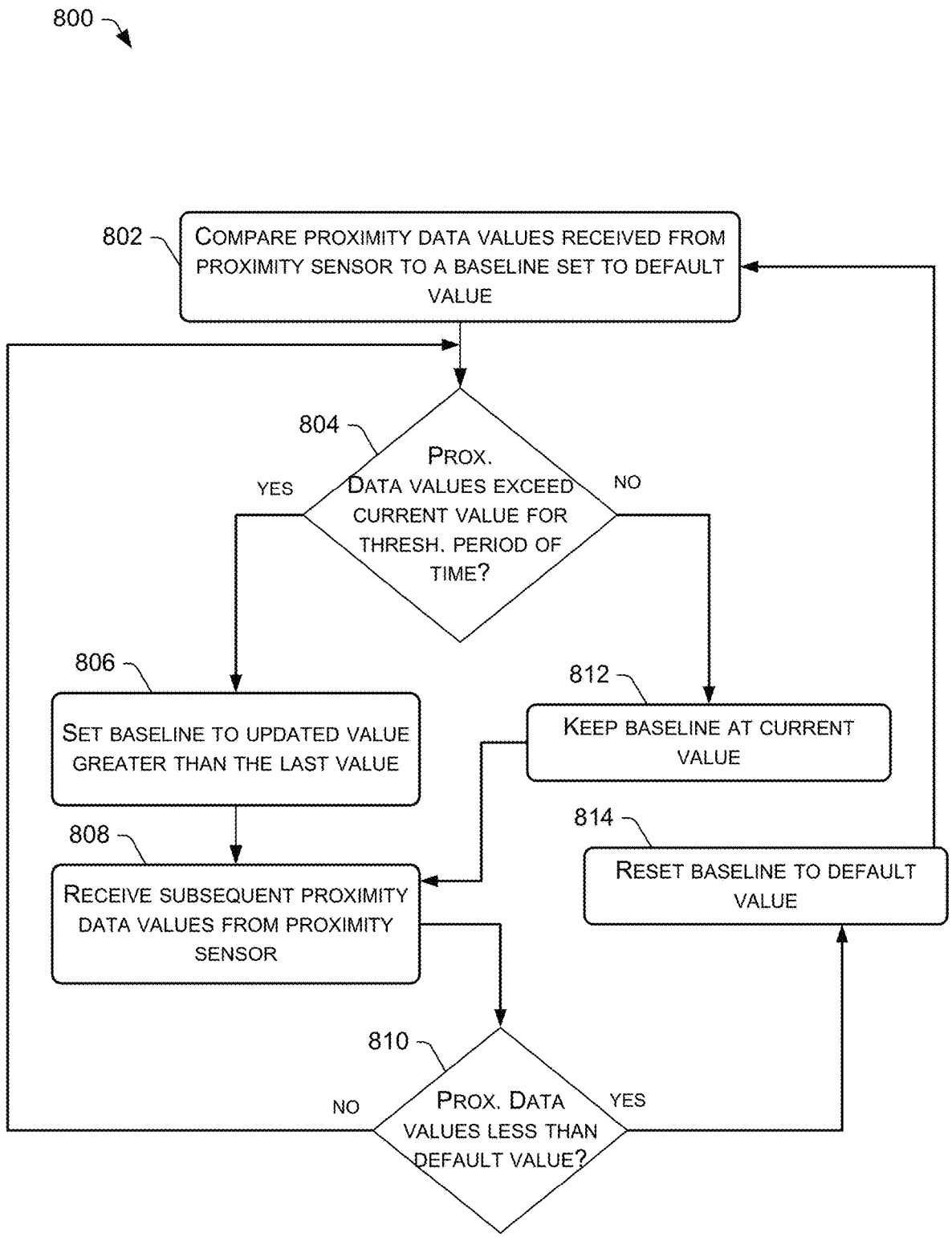
FIG. 8 is a flow diagram of an example process for recalibrating a baseline value for the proximity sensor to ignore proximity detection of unwanted objects.

FIG. 8 is a flow diagram of an example process 800 for recalibrating a baseline value for the proximity sensor 212 to ignore proximity detection of unwanted objects. For discussion purposes, the process 800 is described with reference to the previous figures.

At 802, logic of an electronic device 104 may compare proximity data values of proximity data provided by a proximity sensor 212 to a baseline that is set to a default value. For example, a capacitive-based proximity sensor 212 may be configured to measure capacitance changes at the electrodes of the proximity sensor 212 over time, which is translated into proximity data. Logic of the electronic device 104 may analyze this proximity data to see if the proximity data values exceed the baseline, which may be taken as an indication that an object 306 has moved within a threshold distance, D, from, but not in contact with, the front surface 300 of the faceplate 302 of the electronic device 104. It is to be appreciated that, as the distance between an object 306 and the proximity sensor 212 decreases, the proximity data values increase. This inversely proportional relationship means that proximity data values that start below the baseline will increase as an object 306 moves closer to the proximity sensor 212, thereby decreasing the distance between the object 306 and the proximity sensor 212. At some point during the movement of the object 306 towards the proximity sensor 212, the proximity data values may transition from below the baseline to above the baseline.

At 804, a determination may be made as to whether the proximity data values exceed a current value of the baseline (which, initially, is the default value) for at least a threshold period of time. If the proximity data values exceed the current value of the baseline for the threshold period of time at block 804, the process 800 may follow the "YES" route from block 804 to block 806.

At 806, the baseline can be set to an updated value that is greater than the current value (in the initial case, the current value is the default value). This changes the sensitivity of the proximity sensor 212 to be less sensitive to detecting objects that approach, without contacting, the electronic device 104.

At 808, subsequent proximity data values may be provided by the proximity sensor 212. At 810, a determination is made as to whether the subsequent proximity data value(s) are less than the default value of the original baseline. If the subsequent proximity data values are not less than the default value, the process 800 may follow the "NO" route from block 810 to block 804, where a determination is made as to whether the subsequent proximity data values exceed the current value of the baseline (which is now the updated value set at block 806) for at least the threshold period of time. If the subsequent proximity data values exceed the current value of the baseline for the threshold period of time at block 804, the process 800 may iterate blocks 806, 808, and 810, such as by ratcheting up (or incrementally increasing) the baseline value whenever a new baseline value is exceeded for a threshold period of time. This enables canceling out signals from grounded objects (e.g., cables plugged into the wall) that are in front of the electronic device 104, within the threshold distance, D, but not moving away from the electronic device 104. In this manner, the light emitting element(s) 210 can be turned off when an unintended object briefly sets off the proximity sensor 212.

Returning to block 804, if the proximity data values do not exceed the current value of the baseline (e.g., the default value) for the threshold period of time, the process 800 may follow the "NO" route from block 804 to block 812, where the baseline is kept at the current value (e.g., the default value), and the process 800 may iterate from block 808.

Thus, if an object does not set off the proximity sensor 212 and/or does not remain in the same location in front of the electronic device 104 for a period of time, the baseline is kept at the default value so that the proximity sensor's 212 sensitivity is not adjusted and continues to detect objects that approach the electronic device 104.

Returning to block 810, if it turns out that, after setting the baseline to an updated value, at block 806, the subsequent proximity data values received are less than the default value of the original baseline, the process 800 may follow the "YES" route from block 810 to block 814, where the baseline can be reset to the default value, and the process may iterate from block 802.

The process 800 can represent an algorithm that tunes out unwanted signals over time. Thus, if a power cord that is plugged into the wall is close enough to the electronic device 104 to be detected by the proximity sensor 212, this can be "tuned out" using the algorithm of FIG. 8, and the proximity sensor 212 may thereafter detect other objects (e.g., a user 102) that approach the electronic device 104.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A electronic device comprising:
   a housing containing one or more electrical components of the electronic device and having a faceplate on the housing, the faceplate being made of a material that is transparent;
   one or more processors;
   a first proximity sensor disposed on a back surface of the faceplate, the first proximity sensor configured to provide, to the one or more processors, first proximity data indicative of a first object having moved within a threshold distance from, but not in contact with, a front surface of the faceplate;
   a second proximity sensor disposed on the back surface of the faceplate, the second proximity sensor configured to provide, to the one or more processors, second proximity data indicative of a second object having moved within the threshold distance, or a different threshold distance, from the front surface of the faceplate;
   a touch sensor disposed within the housing behind a location on the front surface of the faceplate, the touch sensor configured to provide, to the one or more processors, touch data indicative of the first object, or a third object, contacting the front surface of the faceplate at the location;
   one or more light emitting elements disposed within the housing adjacent to the touch sensor; and
   logic configured to:
      adjust a sensitivity of the first proximity sensor based at least in part on the second proximity data provided by the second proximity sensor;
      after the sensitivity of the first proximity sensor has been adjusted, illuminate the one or more light emitting elements based at least in part on the first proximity data provided by the first proximity sensor, wherein at least some light that is emitted from the one or more light emitting elements passes through the faceplate; and
      cause closure of a circuit based at feast in part on the touch data provided by the touch sensor, wherein the closure of the circuit causes power to be supplied to the one or more electrical components of the electronic device.

2. The electronic device of claim 1, wherein the first proximity sensor comprises a pattern of metal material printed on the back surface of the faceplate.

3. The electronic device of claim 1, wherein the faceplate is rectangular, a first dimension of the faceplate being longer than a second dimension of the faceplate, and wherein the first proximity sensor spans at least half of the first dimension and at least half of the second dimension.

4. The electronic device of claim 1, further comprising a substrate disposed behind the faceplate, the substrate having at least one biased member extending from a front surface of the substrate, the at least one biased member being electrically conductive, wherein:
   the plurality of light emitting elements are disposed on the front surface of the substrate; and
   the at least one biased member is in contact with the first proximity sensor.

5. The electronic device of claim 4, wherein:
   the touch sensor comprises a second capacitive sensor element disposed on the back surface of the faceplate;
   the substrate includes a second biased member extending from the front surface of the substrate, the second biased member being electrically conductive; and
   the second biased member is in contact with the second capacitive sensor element.

6. The electronic device of claim 1, wherein the one or more light emitting elements include a plurality of light emitting elements arranged in a circular pattern around the touch sensor.

7. The electronic device of claim 1, further comprising a light guide disposed on the back surface of the faceplate, wherein:
   the touch sensor is disposed on the back surface of the faceplate; and
   the light guide is annular in shape and at least partially surrounds the touch sensor.

8. A method comprising:
   receiving first proximity data from a first proximity sensor of an electronic device, the first proximity data indicative of a first object having moved within a threshold distance from a front surface of a faceplate of the electronic device, wherein the faceplate is transparent;
   adjusting a sensitivity of a second proximity sensor of the electronic device based at least in part on the first proximity data received from the first proximity sensor;
   receiving second proximity data from the second proximity sensor after the sensitivity of the second proximity sensor has been adjusted, the second proximity data indicative of a second object having moved within the threshold distance, or a different threshold distance, from, but not in contact with, the front surface of the faceplate; and
   illuminating one or more light emitting elements based at least in part on the second proximity data, wherein the one or more light emitting elements are disposed behind the faceplate adjacent to a touch sensor associated with a power switch of the electronic device, and wherein at least some light emitted from the one or more light emitting elements passes through the faceplate.

9. The method of claim 8, further comprising:
   receiving touch data from the touch sensor, the touch data indicative of the second object, or a third object, contacting the front surface of the faceplate at a location on the front surface of the faceplate in front of the touch sensor; and closing a circuit based at least in part on the touch data, wherein closure of the circuit causes power to be supplied to one or more electrical components of the electronic device.

10. The method of claim 9, further comprising determining, based at least in part on the touch data, that the second object, or the third object, has remained in contact with the front surface of the faceplate at the location for a predefined period of time, wherein the closing of the circuit occurs based at least in part on the second object, or the third object, remaining in contact with the front surface of the faceplate at the location for the predefined period of time.

11. The method of claim 9, wherein the illuminating comprises illuminating the one or more light emitting elements at a first intensity level based at least in part on the second proximity data, the method further comprising:

illuminating the one or more light emitting elements at a second intensity level different than the first intensity level based at least in part on the touch data; and reverting to the illuminating of the one or more light emitting elements at the first intensity level after the illuminating of the one or more light emitting elements at the second intensity level.

12. The method of claim 8, further comprising:

determining that the second object has moved within the threshold distance, or the different threshold distance, from, but not in contact with, the front surface of the faceplate based on a comparison between proximity data values of the second proximity data and a baseline that is set to a default value;

determining that the proximity data values exceed the default value for a threshold period of time; and setting the baseline to an updated value that is greater than the default value based at least in part on the proximity data values exceeding the default value for the threshold period of time.

13. The method of claim 12, further comprising:

determining that subsequent proximity data values of subsequent second proximity data provided by the second proximity sensor are less than the default value; and resetting the baseline to the default value.

14. An electronic device comprising:

a housing having a faceplate that is transparent;

one or more processors;

a touch sensor associated with a power switch, the touch sensor disposed behind a location on a front surface of the faceplate;

a first proximity sensor disposed on a back surface of the faceplate, the first proximity sensor configured to provide, to the one or more processors, first proximity data indicative of a first object having moved within a threshold distance from, but not in contact with; the front surface of the faceplate;

a second proximity sensor disposed on the back surface of the faceplate, the second proximity sensor configured to provide, to the one or more processors, second proximity data indicative of a second object having moved within the threshold distance, or a different threshold distance, from the front surface of the faceplate;

one or more light emitting elements disposed within the housing, behind the faceplate, and adjacent to the touch sensor; and logic configured to:

adjust a sensitivity of the first proximity sensor based at least in part on the second proximity data provided by the second proximity sensor; and after the sensitivity of the first proximity sensor has been adjusted, illuminate the one or more light emitting elements based at least in part on the first proximity data provided by the first proximity sensor, wherein at least some light emitted from the one or more light emitting elements passes through the faceplate.

15. The electronic device of claim 14, wherein the touch sensor is configured to provide, to the one or more processors, touch data indicative of the first object, or a third object, contacting the front surface of the faceplate at the location, and wherein the logic is further configured to close a circuit via the power switch based at least in part on the touch data provided by the touch sensor, wherein closure of the circuit causes power to be supplied to one or more electrical components of the electronic device.

16. The electronic device of claim 14, wherein the one or more light emitting elements include a plurality of light emitting elements arranged in a pattern around the touch sensor.

17. The electronic device of claim 14, wherein the touch sensor is disposed on the back surface of the faceplate, wherein the one or more light emitting elements are disposed on a front surface of a substrate that is disposed behind the faceplate, the electronic device further comprising:

a light guide disposed on the back surface of the faceplate, the light guide having an annular shape.

18. The electronic device of claim 14, wherein the second object is a cable, and wherein the second proximity data is indicative of the cable having been plugged into a port via an aperture defined in the faceplate.

19. The electronic device of claim 14, wherein adjusting the sensitivity of the first proximity sensor comprises decreasing the sensitivity of the first proximity sensor.

20. The electronic device of claim 14, wherein the first proximity sensor is disposed on a first side of the touch sensor and the second proximity sensor is disposed on a second, opposite side of the touch sensor.

* * * * *